United States Patent [19]

Woychik et al.

[11] Patent Number: 5,581,877

[45] Date of Patent: Dec. 10, 1996

[54] METHOD OF FABRICATION OF A CIRCUIT BOARD ADAPTED TO RECEIVE A SINGLE IN-LINE MODULE

[75] Inventors: Gerard A. Woychik, Waukesha, Wis.; John C. Mather, Cedar Rapids, Iowa

[73] Assignee: Allen-Bradley Company, Inc., Milwaukee, Wis.

[21] Appl. No.: 316,316

[22] Filed: Sep. 30, 1994

[51] Int. Cl.⁶ ................................................ H01K 3/10
[52] U.S. Cl. ..................... 29/852; 29/832; 228/180.21
[58] Field of Search ........................... 29/840, 832, 846; 228/180.21, 180.22, 47

[56] References Cited

U.S. PATENT DOCUMENTS

| | | |
|---|---|---|
| 4,693,408 | 9/1987 | Dines et al. ............... 228/180.21 X |
| 4,700,272 | 10/1987 | Bellamy . | 
| 5,297,000 | 3/1994 | Freige et al. . |
| 5,313,699 | 5/1994 | Freige et al. . |
| 5,321,585 | 6/1994 | Trittschuh, III et al. ............ 29/832 |

*Primary Examiner*—Carl J. Arbes
*Attorney, Agent, or Firm*—John M. Miller; John J. Horn

[57] ABSTRACT

A mounting for a single in-line package (SIP) module includes an elongated slot aperture for receiving an edge of the module. The module may be a circuit board or other electrical device and preferably includes edge finger connectors. The elongated slot aperture preferably includes hemicylinders located about the periphery. The hemicylinders provide plated through conductors for connecting to the finger connectors of the module. The aperture is made according to an advantageous method in which the aperture is etched in order to remove barbs or extra copper material caused by milling the aperture. Preferably, the module fits into the aperture with an interference or size-on-size fit. The aperture may include strain relief areas.

18 Claims, 3 Drawing Sheets

METHOD OF FABRICATION OF A CIRCUIT BOARD ADAPTED TO RECEIVE A SINGLE IN-LINE MODULE

FIELD OF THE INVENTION

The present invention relates to a circuit board, and more particularly to a circuit board including a mount for receiving a second circuit board or single in-line package module.

BACKGROUND OF THE INVENTION

In general, circuit boards (e.g., motherboard) often contain single in-line package (SIP) modules such as circuit boards, electrical devices, resistors, capacitors, or other electronic equipment. The SIP modules often include leads, fingers, pins, or other interface members arranged in a single line. The modules are mounted to the motherboard in a perpendicular fashion to maximize the number of devices, components, circuit boards, or equipment attached to the motherboard.

Generally, the modules require module interconnection systems (e.g., connectors, header assemblies, or other hardware) to interface the module with the motherboard. Module interconnection systems often include pins bent at a 90 degree angle. First ends of the pins are inserted into holes in the module, and second ends of the pins are inserted into holes in the motherboard. An insulating frame is provided between the first and second ends. The frame which is located proximate the 90° bend in the pins is usually rectangularly shaped and provides a stable seat or structure between the motherboard and module. The first and second ends of the pins are soldered to contact areas proximate the holes on the module and motherboard, respectively. Alternatively, module interconnection systems may include slot edge connectors, card connectors, or other printed circuit (PC) board connectors.

Such interconnection systems are expensive, bulky and add to the cost of assembling the motherboard. When using these systems, the systems must be connected to the motherboard and connected to the module in separate assembly steps. Also, the systems generally cannot be attached to the motherboard and module with a wave soldering technique.

Thus, there is a need for an improved motherboard having a mounting area for receiving an SIP module. The mounting area for the module is preferably low cost, easy to manufacture, allows the module to be efficiently connected to the motherboard, and reliably supports the module on the motherboard.

SUMMARY OF THE INVENTION

The present invention relates to a circuit board configured to support at least one SIP module at a top surface. The board has an aperture extending into the board for receiving an end of the module, and at least one conductive trace on the top surface about the periphery of the aperture. The aperture has conductive regions along an interior side of the aperture. The trace is coupled to the conductive regions.

The present invention also relates to a circuit board system including a first circuit board having an edge and a second circuit board including a mounting area. The first circuit board is coupled to the second circuit board at the mounting area which includes a slot cut into the first circuit board configured to receive the edge of the first circuit board. Preferably, the first and second circuit boards are mounted perpendicular to each other.

The present invention further relates to a motherboard upon which a SIP finger module is mounted. The SIP finger module has module connector regions. The motherboard includes at least one layer having an aperture within a mounting area. The mounting area includes first electrical connector regions located about a periphery of the aperture. Preferably, the SIP finger module is mounted in the aperture and the first connector region is configured to be coupled within the aperture to the connector regions on the module.

The present invention advantageously allows a SIP module or other device to be mounted to a circuit board without the use of a module interconnection system or other hardware. The module is set on a top side of the motherboard and wave soldered to a mounting area. The module is preferably a printed circuit board having fingers along an edge.

In one aspect of the present invention, the motherboard has a hole for receiving the module. The module includes finger edge connectors configured to mate with plated finger connectors about the periphery of the hole. Preferably, the plated finger connectors are hemicylinders.

In another aspect of the present invention, the motherboard includes a slot for receiving an end of the module and supporting the module with an interference or a size-on-size fit. The slot may include strain relief regions and hemicylinders provided about its periphery. Preferably, the slot is etched to remove any barbs, burrs, or other copper separation caused during the manufacture of the slot. The slot is also advantageously reflow soldered to provide a consistent plated connector through the aperture.

BRIEF DESCRIPTION OF THE DRAWINGS

Preferred embodiments of the invention will hereinafter be described in conjunction with the appended drawings, wherein like numerals denote like elements, and.

DETAILED DESCRIPTION OF PREFERRED EXEMPLARY EMBODIMENTS

Figure 1:
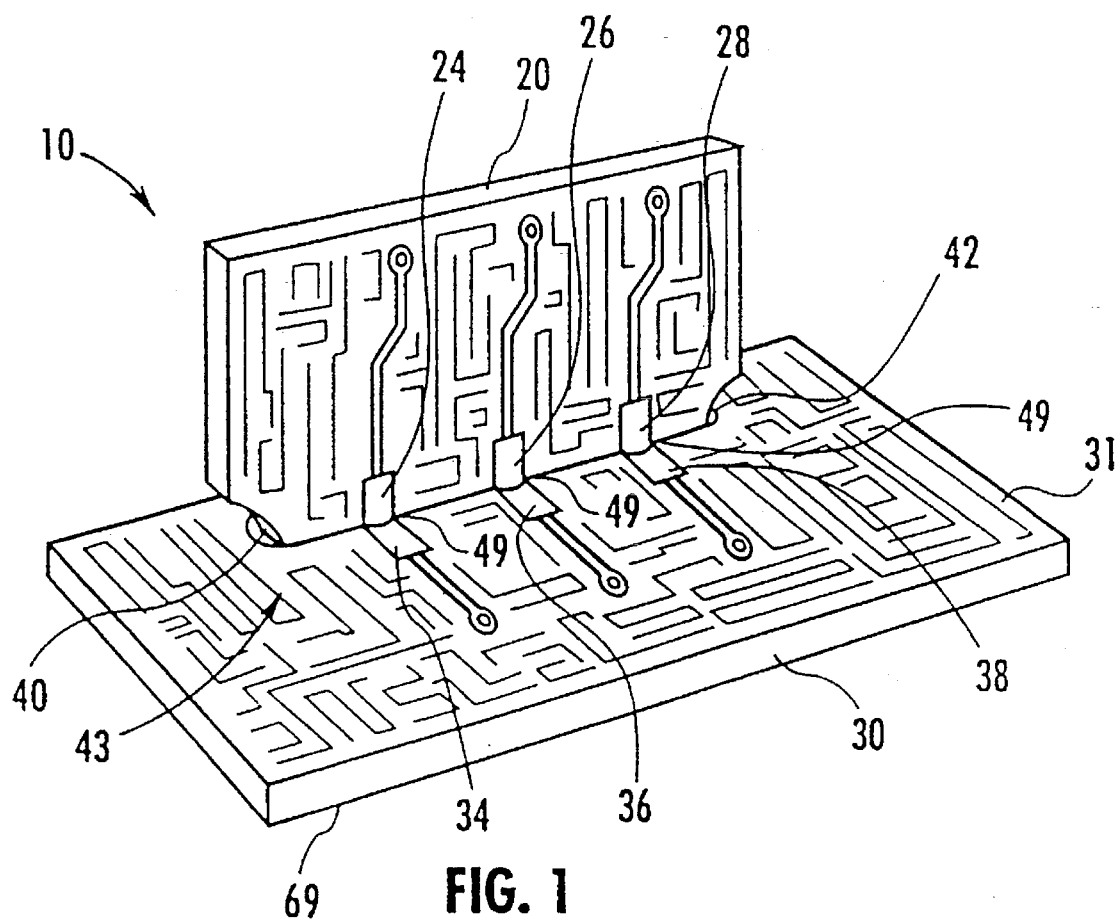
FIG. 1 is a perspective view of an SIP module and motherboard in accordance with a preferred exemplary embodiment of the present invention.

FIG. 1 shows a circuit board system 10 including a SIP module 20 mounted in a perpendicular fashion on a parent board or motherboard 30. Circuit board system 10 may be utilized in a variety of electrical and electronic environments to perform numerous applications. Circuit board system 10 may include a board 30 configured to support a large number of modules 20.

Module 20 is mounted to a slot 40 in a mounting area 43 of motherboard 30. Finger connectors 24, 26 and 28 are in electrical communication with finger connectors 34, 36 and 38 on a top surface 31, respectively, when module 20 engages board 30. Module 20 is supported by an interior wall 42 of slot 40. Slot 40 preferably extends from top surface 31 to a bottom surface 69. Interior wall 42 includes hemicylinders 49 (discussed in more detail below) physically and electrically coupled to connectors 34, 36 and 38.

System 10 advantageously transfers the stresses on module 20 into motherboard 30 without weakening the coupling between module 20 and board 30 (e.g., the solder joints in slot 40). System 10 utilizes the inherent strength associated with board 30 to provide a stable mounting for module 20. Slot 40 may be designed to provide a size-on-size fit, interference fit, larger than size-on-size fit or strain relief fit for module 20 as discussed below with reference to FIGS. 3–7.

Figure 2:
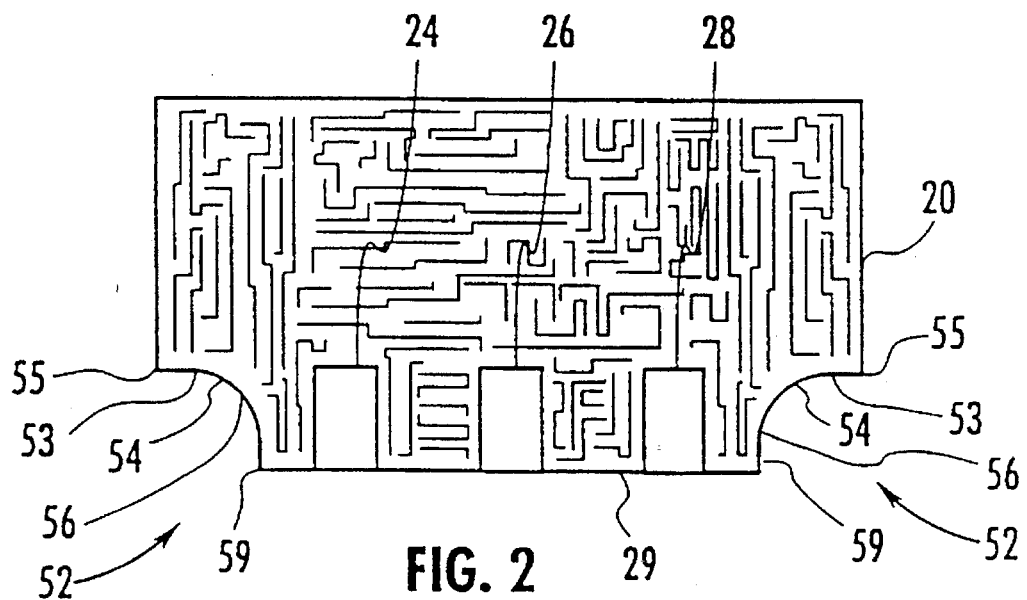
FIG. 2 is a side view of the SIP module illustrated in FIG. 1.

With reference to FIG. 2, SIP module 20 is a structure such as a printed circuit board including electrical components and associated circuitry. Alternatively, module 20 may be a resistor package, electronics device, integrated circuit, or other electrical arrangement. Module 20 allows a large number of components to be housed on a relatively small area of board 30. Module 20 includes knee regions 52 proximate an edge 29. Knee regions 52 structurally support module 20 in slot 40, as is discussed below with reference to FIGS. 3–5 below.

Figure 3:
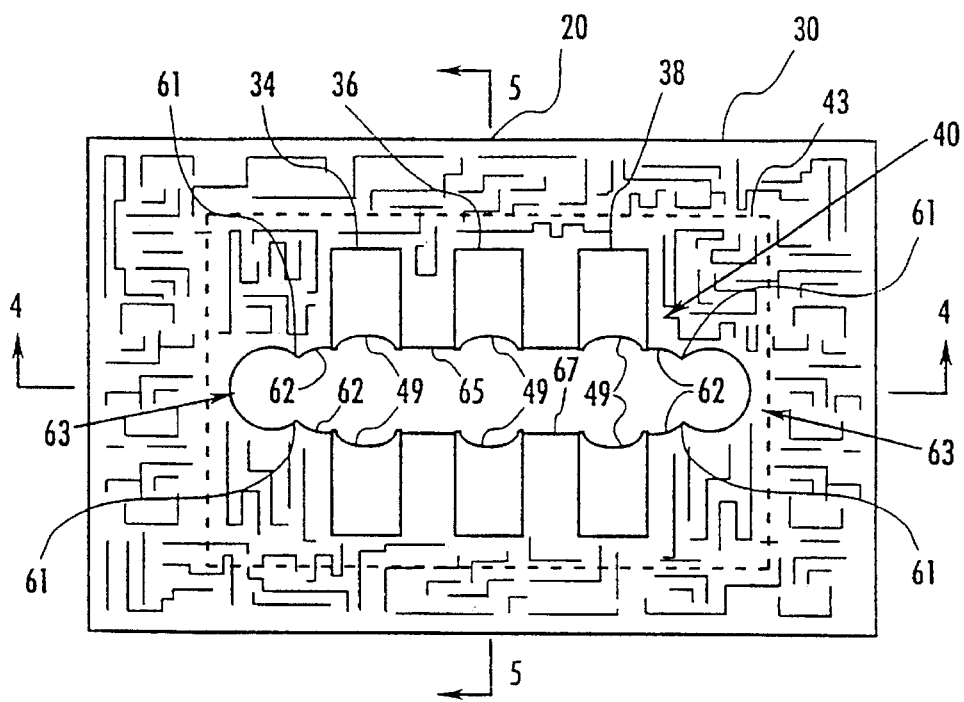
FIG. 3 is a top view of the motherboard illustrated in FIG. 1 in accordance with a first exemplary aspect of the present invention.
Figure 4:
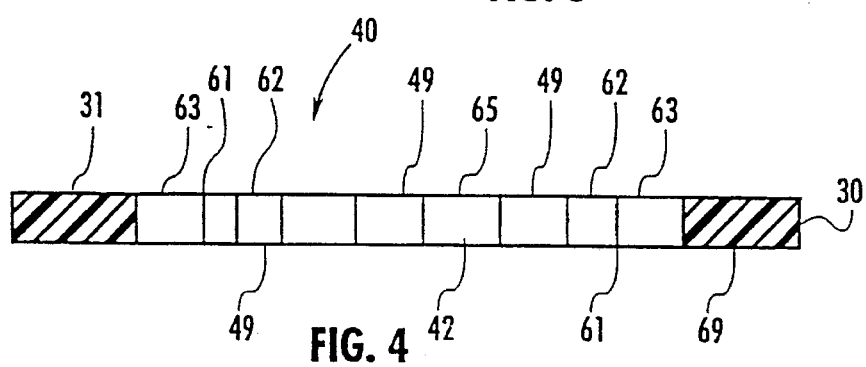
FIG. 4 is a section view of the motherboard illustrated in FIG. 3 along line 4—4.
Figure 5:
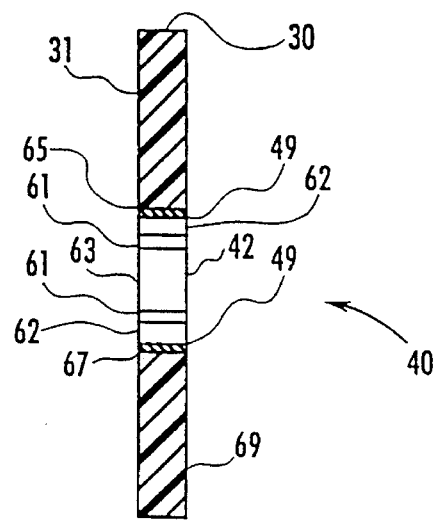
FIG. 5 is a section view of the motherboard illustrated in FIG. 3 along line 5—5.

With reference to FIGS. 3–5, motherboard 30 is a printed wire circuit or pc board. Motherboard 30 may be a single layer or multi-layer circuit board. Board 30 may include numerous mounting areas such as mounting area 43 and may include connectors similar to connectors 34, 36 and 38 on bottom surface 69 of board 30.

Board 30 includes mounting area 43 having a generally oval shaped slot 40. Slot 40 is a partially plated slot defined by interior wall 42. Interior wall 42 includes hemicylinders 49 about the periphery of slot 40. Hemicylinders 49 are in electrical communication with connectors 34, 36 and 38. Hemicylinders 49 provide a stable electrical contact and physical mounting for module 20 in slot 40 of board 30.

Hemicylinders 49 are advantageously fabricated by providing features (e.g., drilling holes for pins of standard integrated circuit packages) on board 30. The holes are plated, having a hollow conductive via or a metal barrel which extends from top surface 31 to bottom surface 69 of board 30. When board 30 is cut, milled, or otherwise configured to form slot 40, the holes are sliced (e.g., the edges of slot 40 cross the plated holes), thereby forming hemicylinders 49. Thus, pc board fabrication techniques can be utilized to efficiently produce the difficult to manufacture hemicylinders 49 about the periphery of slot 40.

Slot 40 is advantageously shaped to allow module 20 to be easily attached to board 30. Slot 40 may be an elongated oval or other aperture for receiving module 20. Preferably, slot 40 is configured for an interference fit with knee regions 52 of module 20 (FIG. 2). Slot 40 includes arcuate regions 63 and arcuate regions 62, which define points 61. Alternatively, slot 40 can be configured for a looser (e.g., larger) fit than a size-on-size fit.

Preferably, points 61 engage and deform against regions 56 of module 20 as edge 29 of module 20 is pushed through slot 40. Module 20 is advantageously positioned with connectors 34, 36, and 38 aligning with connectors 24, 26, and 28, respectively, and centered within slot 40 as points 61 are deformed. Knee regions 52 should be positioned in the center of arcuate regions 63 once module 20 engages slot 40. The interference fit provided by points 61 holds module 20 captive as it is attached and yet distances module 20 away from interior wall 42 to allow solder wicking. Solder wicking allows a stable physical and electrical connection to be formed between module 20 and board 30. The configuration of system 10 having slot 40 allows module 20 to be wave soldered, eutectic soldered, reflow soldered or otherwise attached to board 30 in an economical fashion.

In accordance with a preferred exemplary embodiment, dimensions related to module 20 and board 30 are discussed below. With reference to FIG. 2, knee regions 52 have arcuate sections 54 having a radius of 0.046 inches. The distance from a point 55 to a point 56 is approximately 0.078 inches along an axis parallel to edge 29. The distance from a point 59 to a point 53 along an axis perpendicular to edge 29 is 0.071 inches. Edge 29 has a width of 0.249 inches and a thickness of 0.062 inches.

With reference to FIGS. 3–5, points 61 are formed by providing arcuate regions 63 at the ends of elongated slot 40. Arcuate regions 63 have a radius of 0.038 inches. Points 61 extend 0.012 inches from edges 65 and 67 along an axis perpendicular to edges 65 and 67. The width of slot 40 from edge 65 to edge 67 is 0.075 inches. Preferably, slot 40 is slightly wider (e.g., 0.005–0.007 inches) than the thickness of module 20 at edge 29.

Motherboard 30 may be manufactured utilizing economical circuit board fabrication techniques. With reference to FIGS. 3–5, motherboard 30 is manufactured according to the following method. Generally, features such as the holes associated with hemicylinders 49 or other mounting areas are provided on board 30. The holes are plated with copper. Slot 40 for mounting area 43 is then cut into board 30.

After cutting, slot 40 is etched to provide a smooth or clean interior wall 42. Etching slot 40 removes portions of the plated holes associated with hemicylinders 49 or connectors 34, 36, and 38 which may have been partially removed or altered during the cutting of slot 40. A clean interior wall 42 allows module 20 to be easily inserted into slot 40 and attached to motherboard 30. Also, a clean interior wall 42 ensures a secure electrical contact between connectors 24, 26 and 28 and connectors 34, 36 and 38, respectively.

The fabrication of board 30 including mounting area 43 is described as follows more particularly explaining each process step. The holes required for hemicylinders 49 are drilled into board 30 about the periphery of slot 40 which has not yet been milled.

Board 30 is copper plated according to an electroless copper plating technique. Electroless copper plating techniques include chemically depositing copper across board 30. Interior walls of the holes associated with hemicylinders 49, as well as other apertures, are coated with a copper layer in this step forming conducting vias or copper barrels. Next, board 30 is copper plated with an electrolytic panel plating technique, thereby making the copper layer thicker.

A photoresist is applied to board 30 in a pattern representative of the connections and electrical devices which will be provided on board 30. The photoresist preferably defines footprints, contacts for mounting area 43 (e.g., connectors 34, 36 and 38), and copper conductors on board 30. The photoresist prevents additional plating of copper on board 30 wherever the photoresist is present. Next, board 30 is further plated with an electrolytic copper panel plating technique, followed by a copper pattern plating technique, and a tin lead (solder) pattern plating technique. The tin lead plating acts as an etch resist.

After the tin lead is placed on board 30, board 30 is milled to form slot 40. The milling of slot 40 on board 30 leaves burrs or extra copper material in slot 40. Generally, the mill cutter, drill, or router is not able to make a clean cut through the plated holes associated with hemicylinders 49. The cutter tends to push or fold an edge of the plated holes associated with hemicylinders 49 into slot 40. Also, the cutter tends to separate the plated holes from the dielectric material associated with board 30. Extraneous copper in slot 40 prevents a proper fit for module 30 against interior wall 42 and interferes with proper electrical communication between module 20 and board 30. To alleviate the problems associated with the extraneous copper, slot 40 is etched in a step described below.

After slot 40 is formed, the photoresist is then stripped from board 30. Next, board 30 is etched to reveal the pattern which was provided in the photoresist step. The etching further removes most of the extra copper and burrs which have been pushed into slot 40. Board 30 is then coated with the solder mask and reflow soldered with tin lead conductive material such as solder. Reflow soldering may be accomplished by plunging board 30 in a bath of solder and either a hot air solder leveling the tin lead solder or placing board 30 in an oven and heating beyond the eutectic temperature. Reflow soldering ensures an electrically conductive mounting area 43 (e.g. finger connectors 34, 36 and 38 and hemicylinders 49).

Slot 40 may be tented by providing a thin layer of solder mask as discussed below with reference to FIG. 7.

In another embodiment, board 30 is manufactured according to similar steps. However, the milling step is preferably performed after the stripping the photoresist step instead of after the panel plating step as described above. Board 30 is etched after the milling step to remove the excess copper in slot 40 to provide clean interior walls 42 for a secure fit and reliable electric contact for module 20.

Figure 6:
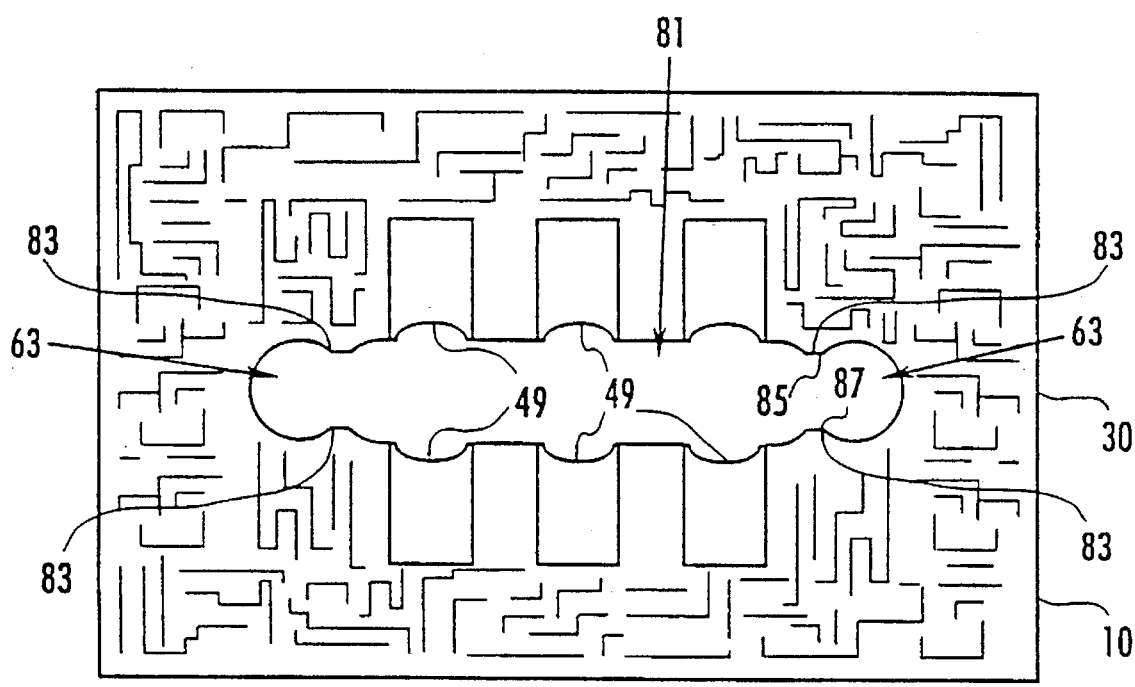
FIG. 6 is a top view of the motherboard illustrated in FIG. 1 in accordance with a second exemplary aspect of the present invention.

FIG. 6 illustrates another embodiment of a motherboard 30 including a slot 81 similar to slot 40 discussed with reference to FIG. 1. Slot 81 is configured for size-on-size fit with module 20 and does not include points 61 discussed with reference to FIGS. 3–5. Regions 83 are in close conformance with knee regions 52 and provide the size-on-size fit for system 10. Slot 81 has an approximate width of 0.062 inches between an edge 85 and an edge 87 at regions 83.

Figure 7:
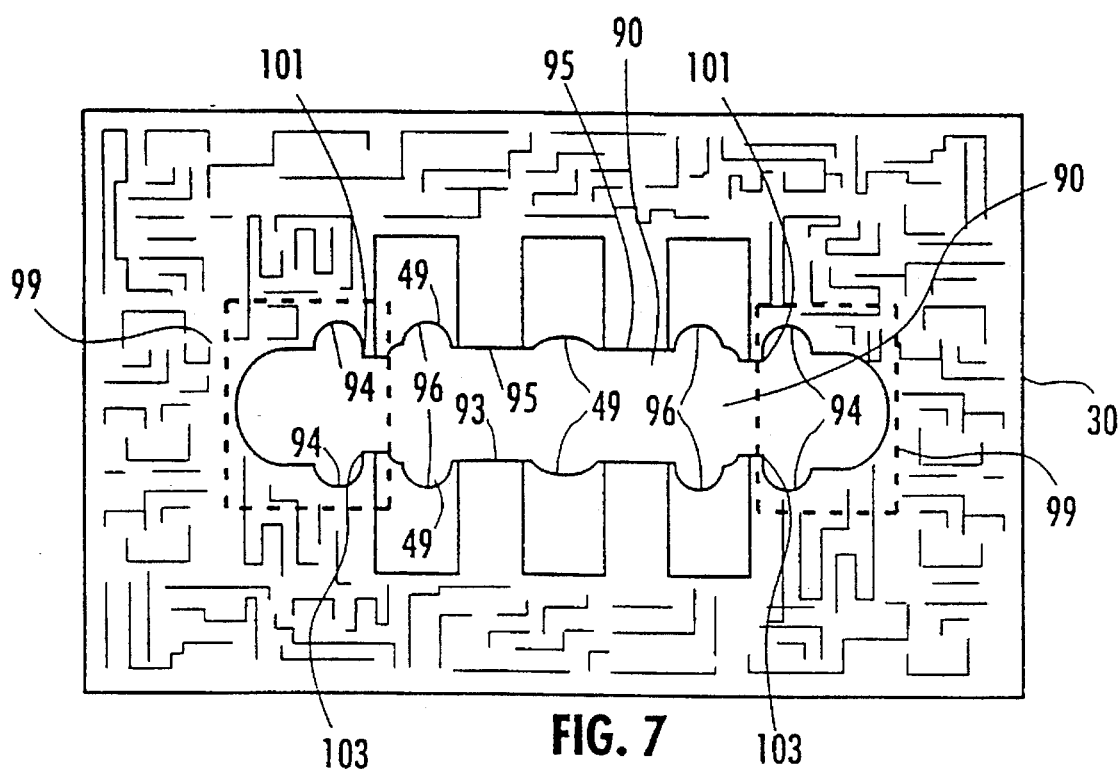
FIG. 7 is a top view of the motherboard illustrated in FIG. 1 in accordance with a third exemplary aspect of the present invention.

With reference to FIG. 7, motherboard 30 includes a slot 90 in accordance with another embodiment similar to slot 81. Slot 90 includes strain relief regions such as regions 94 and regions 96. Additionally, slot 90 is 0.013 inches wider from edge 95 to edge 93 than the width of slot 90 from edge 101 to edge 103. Strain relief regions 94 and 96 advantageously attenuate the forces transferred from module 20 to motherboard 30 when module 20 is bumped, moved or otherwise stressed. Strain relief regions 94 and 96 are semi-circles having a radius of 0.035 inches. The width of slot 90 from edge 101 to edge 103 is 0.062 inches, thereby providing a size-on-size fit with module 20.

Slot 90 may also include tent regions 99. Alternatively, tent regions 99 can cover the entire slot 90. Tent regions 99 are a covering of thin solder mask or other material for providing a more secure fit for module 20. When module 20 is inserted into slot 90, tent regions 99 are punctured and portions of the thin solder mask are pushed in slot 90, thereby providing a stable fit for module 20. Tent regions 99 are thin so interior wall 42 is not completely covered and module 20 is electrically coupled to board 30. Alternatively, a rib (not shown) of solder mask (e.g., 0.007–0.009 inches) can be disposed vertically from edge 29 of module 20.

The dimensions of the holes, slots, modules, and circuit boards may be advantageously optimized for best reliability and structural stability. For example, hemicylinders 49 having an arc greater than 180° are less susceptible to separation from board 30. The arc of hemicylinders 49 are preferably sized from approximately 200°–220°. Further, the shape of slots 40, 81 and 90 of board 30, and of edge 29 of module 20 may be adjusted at various angles to provide a more stable fit. The various dimensions discussed with reference to FIGS. 1–7 are exemplary only and do not limit the scope of the invention as defined in the claims. System 10 may be configured having slots, apertures, hemicylinders, widths, knee regions, and other features of various shapes and sizes.

It is understood that, while the detailed drawings, specific examples, and particular materials given describe a preferred exemplary embodiment of the present invention, they are for the purpose of illustration only. The method and apparatus of the invention is not limited to the precise details and conditions disclosed. For example, although particular shapes of apertures are described, the circuit board may be configured with other various shaped apertures. Although only one board or module is mounted in a single slot, the parent or motherboard may include a multitude of slots and house a multitude of modules. Also, various configurations for connectors may be utilized. Various changes may be made to the details disclosed without departing from the spirit of the invention which is defined by the following claims.

What is claimed is:

1. A method of manufacturing a motherboard configured to support an single in-line package, comprising the steps of:

providing holes in the motherboard;

copper plating the motherboard with an electroless plating technique, thereby plating interior portions of the holes;

copper plating the motherboard with an electrolytic panel plating technique;

milling at least one slot in the motherboard after the copper plating technique;

applying photoresist in a pattern on the motherboard;

copper and tin lead pattern plating the pattern on the motherboard with an electrolytic plating technique;

stripping the motherboard of the photoresist;

etching the motherboard to reveal the pattern; and soldering the motherboard after performing the milling step.

2. The method of claim 1 wherein the milling step is performed immediately after a copper plating the motherboard with an electrolytic panel plating technique step.

3. The method of claim 1 wherein the milling step is performed immediately after the stripping the motherboard of photoresist step.

4. The method of claim 1 wherein the milling step is performed immediately after the copper and tin lead pattern plating step.

5. The method of claim 1 wherein the slots are elongated ovals having an interior portion substantially free of copper burrs caused by the milling step.

6. The method of claim 1 further comprising the step of:

tenting at least a portion of the slot.

7. A method of making a mounting area configured to receive a single in-line package module, the method comprising:

providing plated through holes on the circuit board;

cutting the aperture configured to receive the module in the circuit board, the aperture being defined by an interior aperture side of the circuit board;

etching the interior aperture side of the circuit board; and applying a conductive material to at least a portion of the interior aperture side of the circuit board.

8. The method of claim 7 further comprising the steps of:

drilling holes about a periphery of the aperture, the holes being defined by interior hole sides; and applying a conductive material to the interior hole sides.

9. The method of claim 7 further comprising the step of:

applying a layer of thin material over at least a portion of the aperture.

10. The method of claim 9 wherein the thin material is solder resistant material.

11. The method of claim 7 wherein the cutting step is performed by routing.

12. The method of claim 7 wherein the cutting step is performed by drilling.

13. The method of claim 7 wherein the module is a circuit board module.

14. The method of claim 7 wherein hemicylinders are located about the periphery of the aperture.

15. The method of claim 14 wherein the circuit board includes conductive fingers coupled with the hemicylinders.

16. The board of claim 15 further comprising the step of:

applying a conductive material to the first circuit board.

17. The board of claim 15 wherein the aperture is an elongated oval including hemicylinders.

18. The board of claim 15 wherein the cutting step immediately follows the stripping step, and the cutting step is immediately followed by the etching step.

* * * * *